(12) United States Patent
Ogata et al.

(10) Patent No.: US 8,836,369 B2
(45) Date of Patent: Sep. 16, 2014

(54) LATCH CIRCUIT, FLIP-FLOP CIRCUIT, AND DIVIDER

(71) Applicant: Fujitsu Limited, Kawasaki (JP)

(72) Inventors: Yuuki Ogata, Kawasaki (JP); Yoichi Koyanagi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 13/644,115

(22) Filed: Oct. 3, 2012

(65) Prior Publication Data

US 2013/0088260 A1 Apr. 11, 2013

(30) Foreign Application Priority Data

Oct. 7, 2011 (JP) ................................. 2011-223279

(51) Int. Cl.
*G06F 7/38* (2006.01)
(52) U.S. Cl.
USPC .................. 326/46; 326/40; 326/98; 327/166
(58) Field of Classification Search
USPC .............................. 326/39–40, 46, 93, 95–98; 327/165–166
See application file for complete search history.

(56) References Cited

U.S. PATENT DOCUMENTS

| | | | | |
|---|---|---|---|---|
| 6,380,778 B2 * | 4/2002 | Uehara et al. | ................. | 327/175 |
| 7,388,416 B2 * | 6/2008 | Marutani | ...................... | 327/201 |
| 7,710,155 B2 * | 5/2010 | Bhatia et al. | ................... | 326/93 |
| 7,834,663 B2 * | 11/2010 | Wendell | ....................... | 326/104 |
| 8,058,901 B2 * | 11/2011 | Zhang et al. | ..................... | 326/46 |
| 8,164,361 B2 * | 4/2012 | Soltanian et al. | ............. | 326/113 |
| 8,519,742 B2 * | 8/2013 | Zhang et al. | ..................... | 326/93 |
| 8,610,461 B2 * | 12/2013 | Stephani et al. | ................ | 326/56 |

FOREIGN PATENT DOCUMENTS

JP 2009-110317 5/2009

* cited by examiner

*Primary Examiner* — Jason M Crawford
(74) *Attorney, Agent, or Firm* — Staas & Halsey LLP

(57) ABSTRACT

A latch circuit switches a differential operation performed by a differential operation circuit including a first logic circuit, a second logic circuit, a third logic circuit, and a fourth logic circuit and a single end operation performed by a single end operation circuit according to a logic level of an inputted selection signal. The latch circuit performs an operation to output an input signal and an inverted input signal without change from a first output terminal and a second output terminal of the latch circuit, respectively, and an operation to set the input signal and the inverted input signal in a hold state in the differential operation and performs an operation to output the input signal from the first output terminal without change and an operation to set the input signal in a hold state in the single end operation, according to a clock signal and an inverted clock signal.

10 Claims, 13 Drawing Sheets

FIG. 7

|  | DP | DN | CKP | CKN | SEL | QP | QN |
|---|---|---|---|---|---|---|---|
| (1) | 0 | 1 | 1 | 0 | 0 | 0 | 1 |
| (2) | 1 | 0 | 1 | 0 | 0 | 1 | 0 |
| (3) | 0 | x | 1 | 0 | 1 | 0 | 0 |
| (4) | 1 | x | 1 | 0 | 1 | 1 | 0 |
| (5) | x | x | 0 | 1 | 0 | HOLD | |
| (6) | x | x | 0 | 1 | 1 | HOLD | 0 |
| (7) | 0 | 0 | x | x | 0 | NOT ALLOWED | |
| (8) | 1 | 1 | x | x | 0 | NOT ALLOWED | |
| (9) | x | x | 0 | 0 | x | NOT ALLOWED | |
| (10) | x | x | 1 | 1 | x | NOT ALLOWED | | x:DON'T CARE ially pointed out in the claims.
LATCH CIRCUIT, FLIP-FLOP CIRCUIT, AND DIVIDER

CROSS-REFERENCE TO RELATED APPLICATION

This application is based upon and claims the benefit of priority of the prior Japanese Patent Application No. 2011-223279 filed on Oct. 7, 2011, the entire contents of which are incorporated herein by reference.

FIELD

The embodiment discussed herein is related to a latch circuit, a flip-flop circuit, and a divider.

BACKGROUND

High speed processing and power saving drive as well as multi-functional processing are requested to electronic devices such as digital computers and transmission devices, and accordingly high speed processing and power saving are also requested to LSIs (Large Scale Integrated circuits) mounted on these electronic devices. To respond to the request of high speed processing, circuits of LSIs are designed by using a circuit driven by a differential signal (differential circuit) instead of a circuit driven by a single end signal (singe end circuit). This is because the differential circuit can operate faster than the single end circuit, so that the differential circuit can reduce skew between input signals.

Therefore, Japanese Laid-open Patent Publication No. 2009-110317 discloses an interface circuit (driver circuit) that can selectively switch between voltage-driven type single end transmission and current-driven type differential transmission by a control signal from outside.

SUMMARY

According to an aspect of the invention, a latch circuit includes a first logic circuit configured to receive an input signal from a first input terminal and output a first output signal; a second logic circuit configured to receive an inverted input signal, which is obtained by logically inverting the input signal, from a second input terminal and output a second output signal; a third logic circuit configured to input in the first output signal and a fourth output signal and output a third output signal; and a fourth logic circuit configured to input in the second output signal and the third output signal and output the fourth output signal. The latch circuit switches a differential operation performed by a differential operation circuit including the first logic circuit, the second logic circuit, the third logic circuit, and the fourth logic circuit and a single end operation performed by a single end operation circuit according to a logic level of an inputted selection signal, and performs an operation to output the input signal and the inverted input signal without change from a first output terminal and a second output terminal of the latch circuit, respectively, and an operation to set the input signal and the inverted input signal in a hold state in the differential operation and performs an operation to output the input signal from the first output terminal without change and an operation to set the input signal in a hold state in the single end operation, according to logic levels of an inputted clock signal and an inverted clock signal which is obtained by logically inverting the clock signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a truth table of the latch circuit according to the embodiment;

DESCRIPTION OF EMBODIMENTS

The differential circuit consumes more power than the single end circuit, so that a method for responding to the request of power saving is desirable. For example, if an operation speed of a large scale integrated circuit (LSI) is variable and a differential circuit built in the LSI operates at a low speed, the fact that the differential circuit can operate at a high speed is an excessive specification (that is, an over specification) that exceeds a specification requested for the LSI. As a result, there is a problem that power more than originally requested by the LSI is uselessly consumed.

In a large scale integrated circuit (LSI) which can arbitrarily switch an operation circuit as described above to a high speed operation or a low speed operation, the single end latch circuit is not used while the differential latch circuit is driven, and conversely, the differential latch circuit is not used while the single end latch circuit is driven. In other words, in the large scale integrated circuit of related art, a circuit that is not used in an original operation is added, so that there is a problem that the size of the large scale integrated circuit increases. Further, in the large scale integrated circuit of related art, a circuit that is not used operates at all times, so that the power consumption is large and there is a problem that power saving of the entire LSI is not achieved.

Figure 13:
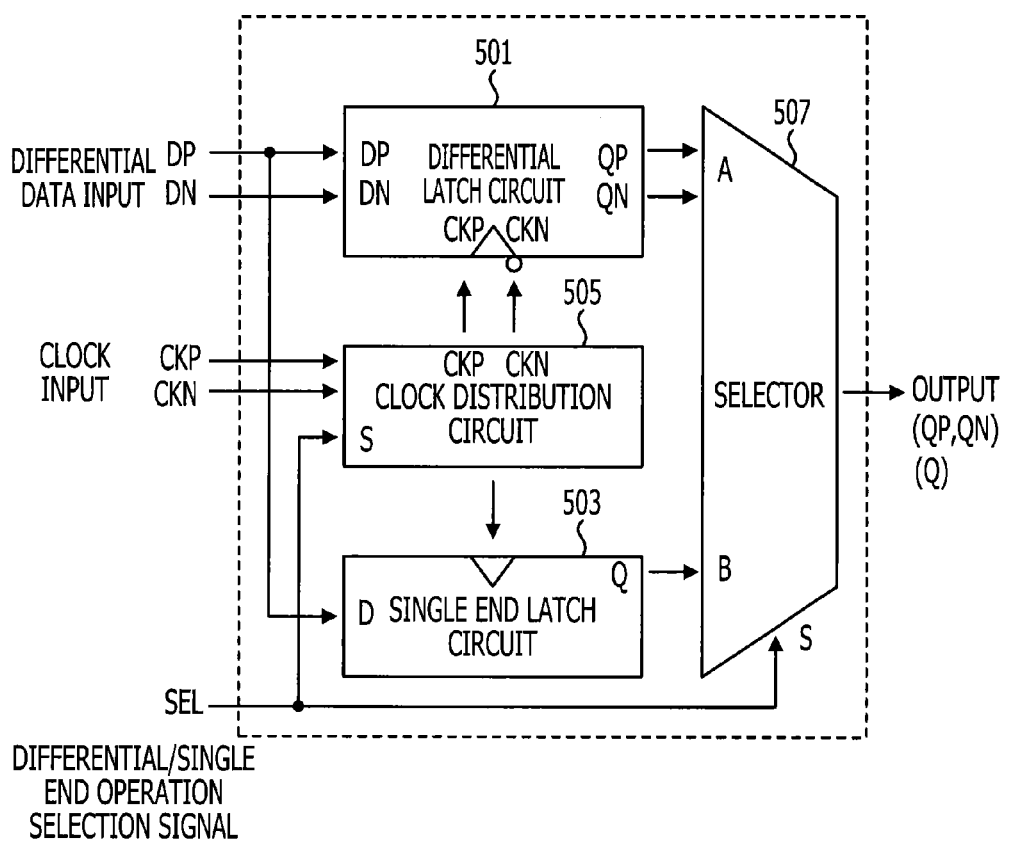
FIG. 13 is a diagram illustrating a comparative example in which of a clock distribution circuit and a selector are added to a differential latch circuit and a single end latch circuit.

As a configuration in which a large scale integrated circuit (LSI) operates at a high speed and power saving is achieved during a low speed operation, for example, the configuration as described below is considered. One differential circuit for high speed operation and one single end circuit for low speed operation are prepared in an LSI. The differential circuit is selected during a high speed operation and the single end circuit is selected during a low speed operation. More specifically, as illustrated in FIG. 13, a differential latch circuit 501 and a single end latch circuit 503 are separately provided in the LSI. A configuration in which a clock distribution circuit 505 and a selector 507 are added to the LSI and the differential latch circuit 501 and the single end latch circuit 503 are arbitrarily switched to each other is considered.

In the configuration illustrated in FIG. 13, clock is supplied from the clock distribution circuit 505 to only the differential latch circuit 501 during the high speed operation and outputs from the differential latch circuit 501 are selected by the selector 507. On the other hand, during the low speed operation, clock is supplied only to the single end latch circuit 503, the operation of the differential latch circuit 501 is stopped, and an output of the single end latch circuit 503 which is driven by low power consumption is selected by the selector 507. In the configuration illustrated in FIG. 13, the clock distribution circuit 505 and the selector 507 which are commonly used by the differential latch circuit 501 and the single end latch circuit 503 are added to the LSI. Therefore, the size of the LSI increases. The clock distribution circuit 505 operates at all times, so that the power consumption is large and it is difficult to perform power saving of the entire LSI.

Further, in the configuration illustrated in FIG. 13, an input terminal DP of differential data input terminals DP and DN is connected to an input terminal of both the differential latch circuit 501 and the single end latch circuit 503. Therefore, the number of fan-outs of DP and the number of fan-outs of DN are different from each other, so that the loads are not balanced. On the other hand, to cancel the imbalance of the input terminals, a load adjustment unit to keep balance is used.

Therefore, power saving during the low speed operation is realized by a latch circuit described below while suppressing the increase of the size of the circuit. Hereinafter, an embodiment will be described with reference to the drawings.

Figure 1:
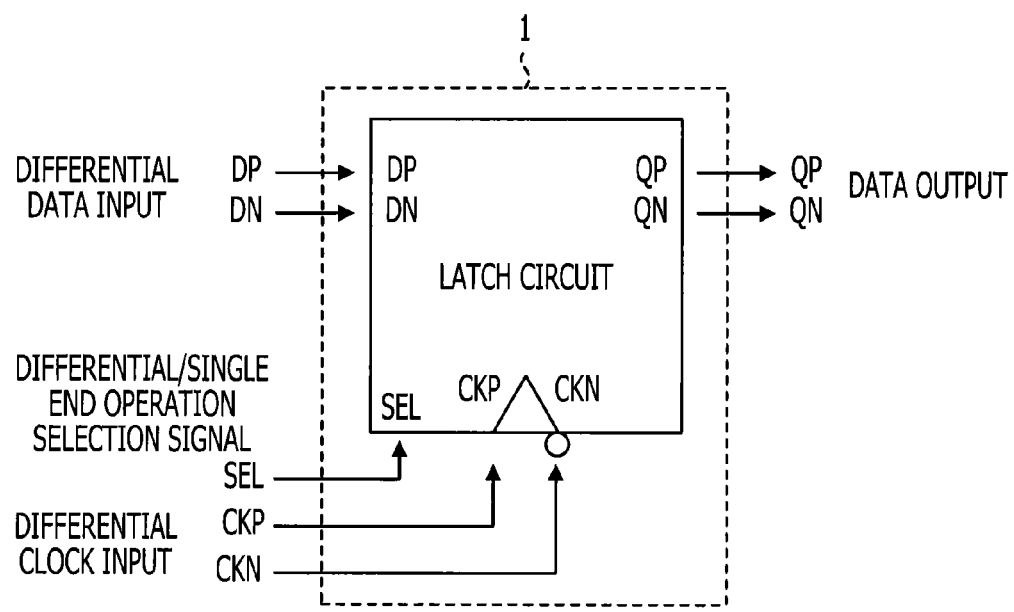
FIG. 1 is a block diagram illustrating a schematic configuration of a latch circuit according to an embodiment.
Figure 2:
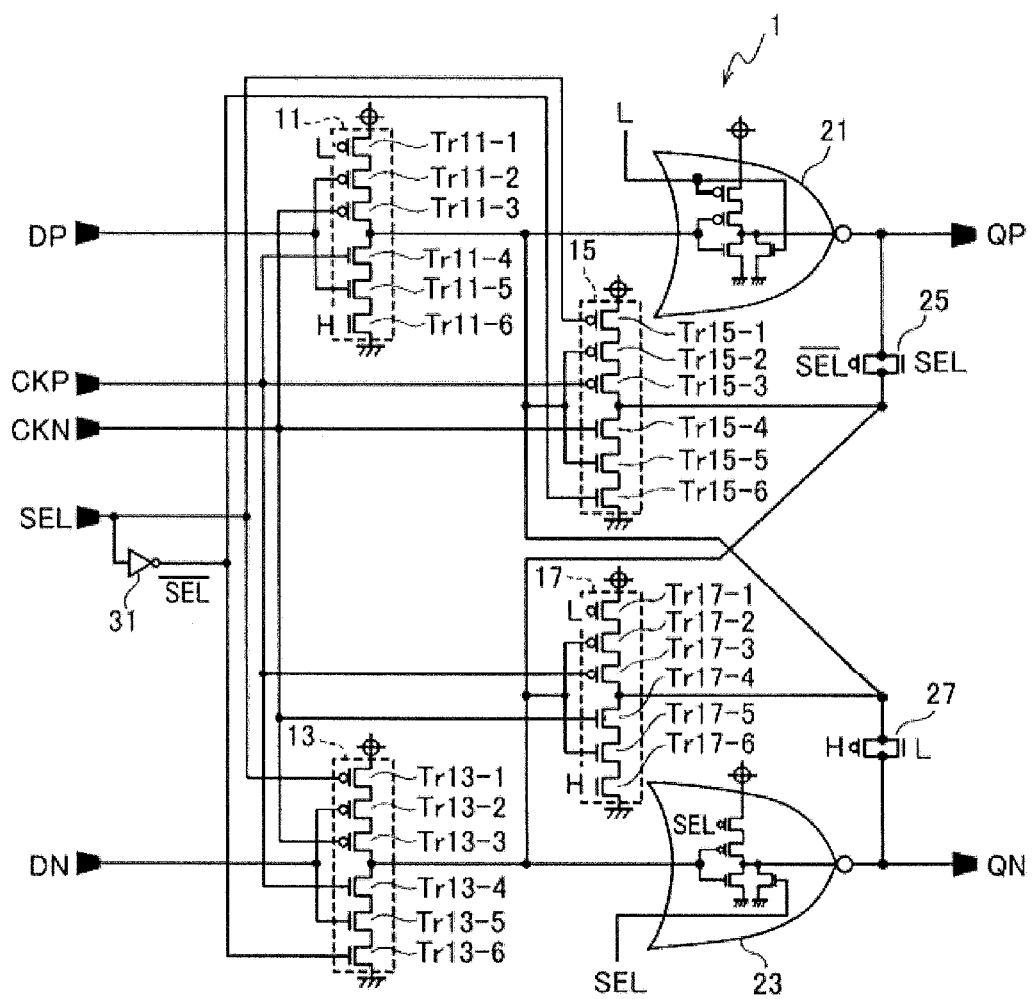
FIG. 2 is a circuit diagram illustrating a detailed configuration of the latch circuit according to the embodiment.

FIG. 1 is a block diagram illustrating a schematic configuration of a latch circuit according to the embodiment. FIG. 2 is a circuit diagram illustrating a detailed configuration of the latch circuit according to the embodiment. FIGS. 3 to 6 are circuit diagrams illustrating a flow of signals corresponding to an operation mode of the latch circuit according to the embodiment.

A latch circuit 1 according to the embodiment is built in a large scale integrated circuit (LSI) or the like having a predetermined function. As illustrated in FIG. 1, by using a 1-bit selection signal SEL as a control signal, it is possible to switch the latch circuit 1 to operate as a differential circuit or a single end circuit. Specifically, when supplying a high speed clock to the latch circuit 1 to operate the latch circuit 1 at a high speed, the selection signal SEL is set to a logic "L" level (hereinafter may be referred to as SEL="0") by control from outside and the latch circuit 1 is operated as a differential circuit. In the differential operation, differential data inputs DP and DN are outputted as differential data outputs QP and QN without change or the state of the inputted data DP and DN is held (hold state) according to values of differential clock inputs CKP and CKN. The clock input CKP and the clock input CKN are logically inverted to each other (hereinafter, the clock input CKN may be referred to as an inverted clock input). Also, the data input DP and the data input DN are logically inverted to each other (the data input DN may be referred to as an inverted data input) and the data output QP and the data output QN are logically inverted to each other (the data output QN may be referred to as an inverted data output).

On the other hand, when operating the latch circuit 1 by a low speed clock, the selection signal SEL is set to a logic "H" level (hereinafter may be referred to as SEL="1") and the latch circuit 1 is operated as a single end circuit. In this case, the data input DP is outputted as a single end data output QP without change or the state of the data input DP is held (hold state) according to a logic value of the clock input CKP.

The logic of the selection signal SEL which causes the latch circuit 1 to operate as a differential circuit or a single end circuit is not limited to the logic described above, but may be an inverted logic to the logic described above.

As illustrated in FIG. 2, the latch circuit 1 according to the embodiment includes four logic circuits 11, 13, 15, and 17, NOR gate circuits 21 and 23, and switch circuits (may be referred to as transfer gates) 25 and 27. In each logic circuit 11, 13, 15, and 17, three P-type (P-channel) MOS transistors are connected in series by connecting the drain electrode of a P-type MOS transistor to the source electrode of a lower P-type MOS transistor. Further, three N-type (N-channel) MOS transistors are connected in series by connecting the source electrode of an N-type MOS transistor to the drain electrode of a lower N-type MOS transistor. The three P-type MOS transistors connected in series and the three N-type MOS transistors connected in series are further connected in series. The switch circuits (transfer gates) 25 and 27 have a configuration in which a P-type MOS transistor and an N-type MOS transistor are connected in parallel.

Hereinafter, the logic circuit 11 is referred to as a first logic circuit, the logic circuit 13 is referred to as a second logic circuit, the logic circuit 15 is referred to as a third logic circuit, and the logic circuit 17 is referred to as a fourth logic circuit. The transistors included in each of the first to the fourth logic circuits 11, 13, 15, and 17 are referred to as first to sixth transistors, respectively, in order from the power supply side to the ground (GND) side. For example, in the first logic circuit 11, the MOS transistors are referred to as a first transistor Tr11-1, a second transistor Tr11-2, a third transistor Tr11-3, a fourth transistor Tr11-4, a fifth transistor Tr11-5, and a sixth transistor Tr11-6.

Similarly, in the second logic circuit 13, the MOS transistors are referred to as a first transistor Tr13-1, a second transistor Tr13-2, a third transistor Tr13-3, a fourth transistor Tr13-4, a fifth transistor Tr13-5, and a sixth transistor Tr13-6. In the third logic circuit 15, the MOS transistors are referred to as a first transistor Tr15-1, a second transistor Tr15-2, a third transistor Tr15-3, a fourth transistor Tr15-4, a fifth transistor Tr15-5, and a sixth transistor Tr15-6. Further, in the fourth logic circuit 17, the MOS transistors are referred to as a first transistor Tr17-1, a second transistor Tr17-2, a third transistor Tr17-3, a fourth transistor Tr17-4, a fifth transistor Tr17-5, and a sixth transistor Tr17-6.

The input of the first transistor Tr11-1 of the first logic circuit 11 is fixed to the logic "L" level and the input of the sixth transistor Tr11-6 is fixed to the logic "H" level. The transistors Tr11-1 and Tr11-6 are in ON-state at all times. The data input DP is inputted into the second transistor Tr11-2 and the fifth transistor Tr11-5. The inverted clock input CKN is inputted into the third transistor Tr11-3. The clock input CKP is inputted into the fourth transistor Tr11-4. The selection signal SEL is inputted into the second transistor Tr13-1 of the second logic circuit 13. The inverted selection signal /SEL is inputted into the sixth transistor Tr13-6 (here, the symbol "/" provided to the signal name means a logic inversion). The inverted data input DN is inputted into the second transistor Tr13-2 and the fifth transistor Tr13-5. The inverted clock input CKN is inputted into the third transistor Tr13-3. The clock input CKP is inputted into the fourth transistor Tr13-4.

The selection signal SEL is inputted into the first transistor Tr15-1 of the third logic circuit 15. The inverted selection signal /SEL is inputted into the sixth transistor Tr15-6. The output signal of the first logic circuit 11 and the output signal of the fourth logic circuit 17 are inputted into the second transistor Tr15-2 and the fifth transistor Tr15-5. The clock input CKP is inputted into the third transistor Tr15-3. The inverted clock input CKN is inputted into the fourth transistor Tr15-4. The input of the first transistor Tr17-1 of the fourth logic circuit 17 is fixed to the logic "L" level and the input of the sixth transistor Tr17-6 is fixed to the logic "H" level. The transistors Tr17-1 and Tr17-6 are in ON-state at all times. The output signal of the second logic circuit 13 and the output signal of the third logic circuit 15 are inputted into the second transistor Tr17-2 and the fifth transistor Tr17-5. The clock input CKP is inputted into the third transistor Tr17-3. The inverted clock input CKN is inputted into the fourth transistor Tr17-4.

As illustrated in FIG. 2, one input terminal of two input terminals of the NOR gate circuit 21 is fixed to the logic "L" level and the selection signal SEL is inputted into one input terminal of two input terminals of the NOR gate circuit 23

Next, the operation of the latch circuit 1 illustrated in FIG. 2 will be described in detail. The latch circuit 1 illustrated in FIG. 2 operates at an operation speed depending on the frequency of an operation clock supplied from outside and operates by being switched to a differential circuit or a single end circuit according to a logic value of the selection signal. In the differential operation of the differential circuit and the single end operation of the single end circuit, the latch circuit 1 operates in a transparent (pass-through) mode in which input data is outputted without change and a hold (latch) mode in which the state of the data input is maintained.

First Differential Operation Mode

A first differential operation mode, in which differential input data is outputted without change, of the differential operation of the latch circuit 1 illustrated in FIG. 2 will be described. When supplying a high-speed clock (for example, 10 GHz) and operating the latch circuit 1 at a high speed, the selection signal SEL is set to "0" to switch the latch circuit 1 to the differential operation mode. The selection signal SEL of the logic "0" level is inputted into the gate electrode of the first transistor Tr13-1 of the second logic circuit 13, the gate electrode of the first transistor Tr15-1 of the third logic circuit 15, and one input terminal of the two input terminals of the NOR gate circuit 23. The inverted selection signal (/SEL="1") obtained by reversing the selection signal SEL="0" is inputted into the gate electrode of the sixth transistor Tr13-6 of the second logic circuit 13 and the gate electrode of the sixth transistor Tr15-6 of the third logic circuit 15.

When the clock input CKP is "1", the inverted clock input CKN is "0", the data input DP is "0", and the inverted data input DN is "1", the latch circuit 1 where the selection signal SEL is logically set as described above operates as described below. In this case, all of the first to the third transistors Tr11-1 to Tr11-3 of the first logic circuit 11 are turned ON (conductive) and the first logic circuit 11 is in an operational state. Then, a signal of logic "1" is outputted from the output terminal of the first logic circuit 11.

Similarly, all of the fourth to the sixth transistors Tr13-4 to Tr13-6 of the second logic circuit 13 are turned ON and a logic "0" is outputted from the second logic circuit 13. The 2-input NOR gate circuits 21 and 23 function as inverters. Therefore, the NOR gate circuit 21 receives the output "1" from the first logic circuit 11 and outputs "0" and the NOR gate circuit 23 receives the output "0" from the second logic circuit 13 and outputs "1". As a result, the data output QP of the latch circuit 1 is "0" which is the same as the data input DP and the inverted data output QN is "1" which is the same as the inverted data input DN.

On the other hand, when the clock input state is the same as that described above (the clock input CKP is "1" and the inverted clock input CKN is "0"), if the data input DP is "1" and the inverted data input DN is "0", the first logic circuit 11 operates as described below. All of the fourth to the sixth transistors Tr11-4 to Tr11-6 of the first logic circuit 11 are turned ON and the output of the first logic circuit 11 is turned "0". All of the first to the third transistors Tr13-1 to Tr13-3 of the second logic circuit 13 are turned ON and the output of the second logic circuit 13 is turned "1". The NOR gate circuit 21 receives the output "0" from the first logic circuit 11 and outputs "1" and the NOR gate circuit 23 receives the output "1" from the second logic circuit 13 and outputs "0". Therefore, the data output QP of the latch circuit 1 is "1" which is the same as the data input DP and the inverted data output QN is "0" which is the same as the inverted data input DN.

When the clock input state is the same as that described above (the logic level of the clock input CKP is "1" and the logic level of the inverted clock input CKN is "0"), the third logic circuit 15 operates as described below. The third transistor Tr15-3 of the third logic circuit 15 receives the CKP="1" to be turned OFF and the fourth transistor Tr15-4 receives the CKN="0" to be turned OFF. Therefore, even when the input from the first logic circuit 11 into the third logic circuit 15 is any of "0" and "1", the third logic circuit 15 is OFF (non-conductive) and a non-operational state is maintained.

Similarly, the third transistor Tr17-3 of the fourth logic circuit 17 receives the CKP="1" to be turned OFF and the fourth transistor Tr17-4 receives the CKN="0" to be turned OFF. Therefore, even when the input from the second logic circuit 13 into the fourth logic circuit 17 is any of "0" and "1", the fourth logic circuit 17 maintains the non-operational state. Also, the switches (transfer gates) 25 and 27 maintain the OFF state.

Figure 3:
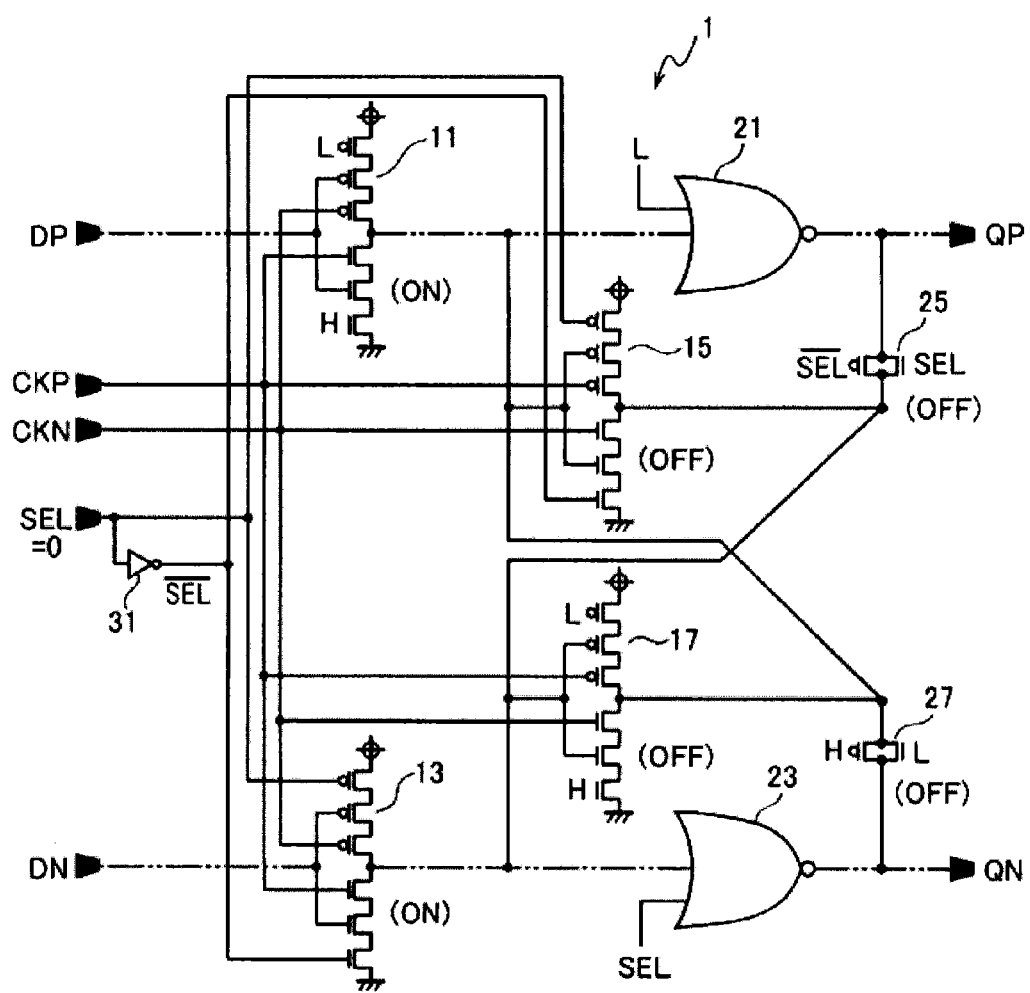
FIG. 3 is a circuit diagram illustrating a flow of signals corresponding to a first differential operation mode of the latch circuit according to the embodiment.

FIG. 3 illustrates a flow of the signals in the latch circuit 1 which operates in the first differential operation mode. As illustrated in FIG. 3, the third logic circuit 15 and the fourth logic circuit 17 become the OFF state and the first logic circuit 11 and the second logic circuit 13 become the ON state at the same time, so that the latch circuit 1 operates as the differential circuit. As illustrated by the two-dot chain line in FIG. 3, it is found that the latch circuit 1 operates in a pass-through mode in which the input data DP and DN pass through the latch circuit 1 and are outputted as the output data QP and QN without change.

FIG. 7 is a truth table illustrating the operation of the latch circuit 1. As described above, when the selection signal SEL is "0", the latch circuit 1 operates as the differential circuit, and when the clock input CKP is "1" and the inverted clock input CKN is "0", the operation of the latch circuit 1 is as illustrated by (1) and (2) in the truth table in FIG. 7. In short, the values of the data inputs DP and DN are outputted as the data outputs QP and QN without change (that is, the pass-through operation in which the input values are outputted without change).

Figure 8:
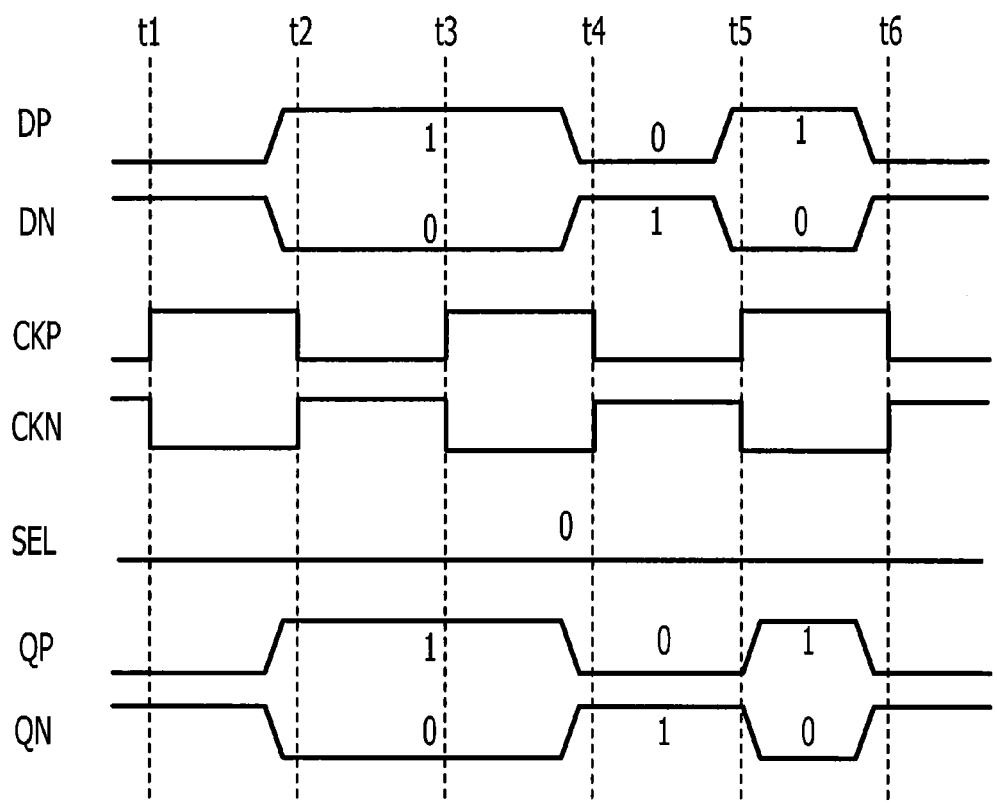
FIG. 8 is a timing chart illustrating operation timing during a differential operation of the latch circuit according to the embodiment.

FIG. 8 is a timing chart when the latch circuit 1 operates as the differential circuit. In FIG. 8, when the selection signal SEL is "0", the CKP is "1", and the CKN is "0", that is to say, during the timing t1 to t2, the timing t3 to t4, and the timing t5 to t6, the values of the data inputs DP and DN are outputted as the data outputs QP and QN respectively without change. This is a pass-through differential operation in the latch circuit 1.

Second Differential Operation Mode

Next, a second differential operation mode, in which differential input data is latched, of the differential operation of the latch circuit 1 illustrated in FIG. 2 will be described. When operating the latch circuit 1 in the differential operation mode, in the same manner as in the first differential operation mode described above, the selection signal SEL is set to "0". When the clock input CKP is "0" and the inverted clock input CKN is "1", even if the data inputs DP and DN are "0" and "1" respectively or "1" and "0" respectively, the latch circuit 1 operates as described below. In other words, in this case, a combination of logic inputs in which all of the first to the third transistors Tr11-1 to Tr11-3 of the first logic circuit 11 of the latch circuit 1 in FIG. 2 are ON does not occur. Also, a combination of logic inputs in which all of the fourth to the sixth transistors Tr13-4 to Tr13-6 of the second logic circuit 13 are ON does not occur. Therefore, in this case, the first logic circuit 11 and the second logic circuit 13 are in the OFF state.

As illustrated in FIG. 2, in the latch circuit 1, a cross-coupled feedback configuration is formed in which the output of the third logic circuit 15 is connected to the input of the fourth logic circuit 17 and the output of the fourth logic circuit 17 is connected to the input of the third logic circuit 15. In other words, there is a feedback signal from the third logic circuit 15 to the fourth logic circuit 17 and there is a feedback signal from the fourth logic circuit 17 to the third logic circuit 15. Here, as illustrated by the timing t2 to t3 in FIG. 8, when the data inputs DP and DN are "1" and "0" respectively immediately before the clock input CKP is turned "0" and the inverted clock input CKN is turned "1", the latch circuit 1 operates as described below. That is, "0" is inputted into the third transistor Tr15-3 of the third logic circuit 15 and all of the first to the third transistors Tr15-1 to Tr15-3 of the third logic circuit 15 are turned ON, so that the third logic circuit 15 is turned ON and "1" is outputted. Similarly, "1" is inputted into the fifth transistor Tr17-5 of the fourth logic circuit 17 and all of the fourth to the sixth transistors Tr17-4 to Tr17-6 of the fourth logic circuit 17 are turned ON, so that the fourth logic circuit 17 is turned ON and "0" is outputted.

As a result, the input of the third logic circuit 15 is "0" and the output the third logic circuit 15 is "1" by the third logic circuit 15 and the fourth logic circuit 17 which have the aforementioned cross-coupled feedback configuration and which are ON at the same time. Thereby, the state in which the input of the fourth logic circuit 17 is "1" and the output the fourth logic circuit 17 is "0" is maintained and the values of the data outputs QP and QN are "1" and "0" respectively. In other words, in the latch circuit 1, a latch state is generated in which the values of the data inputs DP and DN immediately before the clock input CKP is turned "0" and the inverted clock input CKN is turned "1" are held (hold state).

Figure 4:
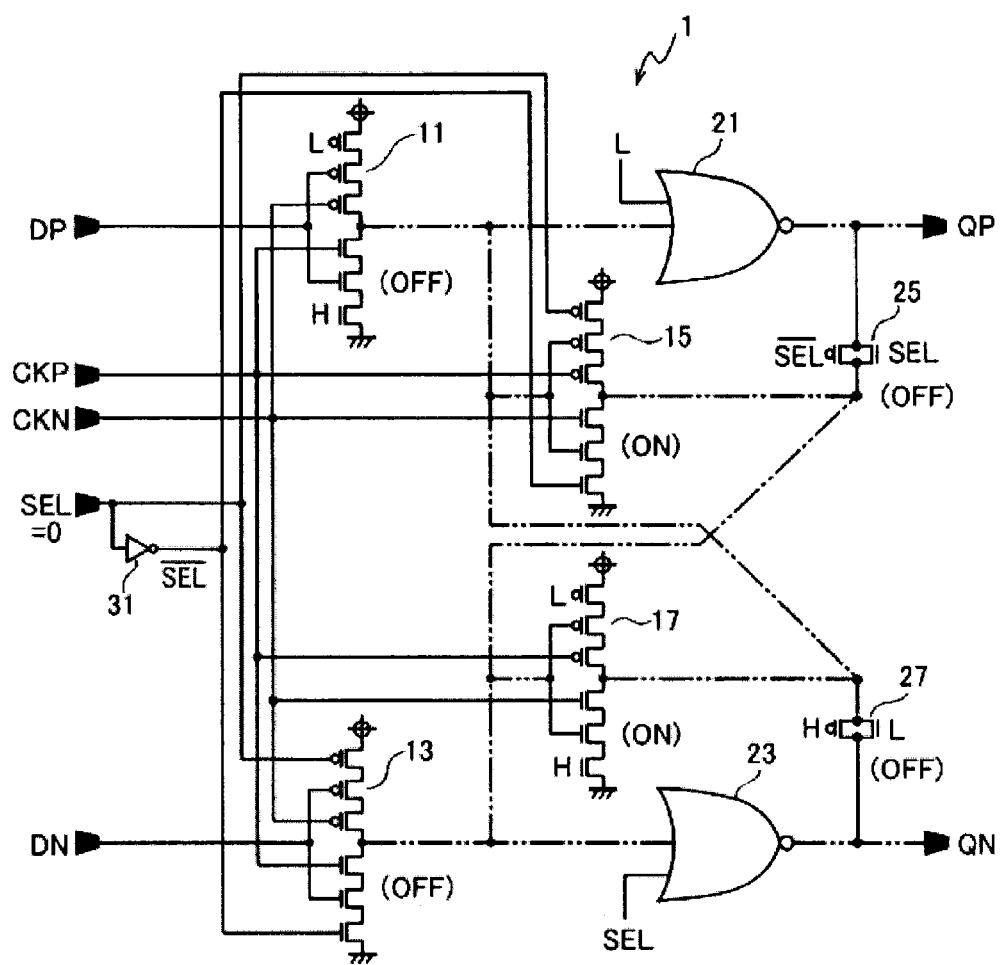
FIG. 4 is a circuit diagram illustrating a flow of signals corresponding to a second differential operation mode of the latch circuit according to the embodiment.

FIG. 4 illustrates a flow of the signals in the latch circuit 1 which operates in the second differential operation mode. As illustrated in FIG. 4, in the latch circuit 1 in the hold state, the cross-coupled third logic circuit 15 and fourth logic circuit 17 are in the ON state and the signals flow as illustrated by the two-dot chain lines in FIG. 4. Therefore, the latch circuit 1 operates so that the input values held by the latch circuit 1 are outputted without change.

The operation of the timing t4 to t5 in FIG. 8 in the second differential operation mode is the same as that of the timing t2 to t3 described above. Specifically, when the selection signal SEL is "0", the clock input CKP is turned "0", and the inverted clock input CKN is turned "1", the state of the data inputs DP (="0") and DN (="1") is held by the latch circuit 1 and the data outputs QP and QN are "0" and "1" respectively without change. As illustrated in FIG. 8, even if the logic levels of the data inputs DP and DN change in the middle of the timing t4 to t5, the logic levels having been held are maintained without change during the timing t4 to t5 by the hold function of the latch circuit 1.

In a data hold state in which the clock input CKP to the latch circuit 1 which performs the differential operation is "0" and the inverted clock input CKN is "1", the latch circuit 1 operates as illustrated by (5) in the truth table in FIG. 7. Specifically, regardless of (that is, don't care) the values of the input data DP and DN, the input data at that time are held by the latch circuit 1 and the data outputs QP and QN corresponding to the input data are maintained without change. The data hold state of the latch circuit 1 during the differential operation is maintained until the clock input CKP is turned "1" and the inverted clock input CKN is turned "0" next time.

First Single End Operation Mode

Next, a first single end operation mode, in which input data is outputted without change, of the single end operation of the latch circuit 1 illustrated in FIG. 2 will be described. When supplying a low-speed clock and operating the latch circuit 1 at a low speed, the selection signal SEL is set to "1" to switch the latch circuit 1 to the single end operation mode. The selection signal SEL="1" is inputted into the gate electrode of the first transistor Tr13-1 of the second logic circuit 13, the gate electrode of the first transistor Tr15-1 of the third logic circuit 15, and one input terminal of the two input terminals of the NOR gate circuit 23. The inverted selection signal (/SEL="0") of the selection signal SEL="1" is inputted into the gate electrode of the sixth transistor Tr13-6 of the second logic circuit 13 and the gate electrode of the sixth transistor Tr15-6 of the third logic circuit 15.

When the logic level of the clock input CKP is "1", the logic level of the inverted clock input CKN is "0", and the logic level of the data input DP is "0", the latch circuit 1 where the selection signal SEL is logically set as described above operates as described below. In this case, regardless of (that is, don't care) the state of the data input DP, all of the first to the third transistors Tr11-1 to Tr11-3 of the first logic circuit 11 of the latch circuit 1 are turned ON and the output of the first logic circuit 11 is turned "1". On the other hand, in this case, the first transistor Tr13-1 of the second logic circuit 13 and the first transistor Tr15-1 of the third logic circuit 15 receive the SEL="1" to be turned OFF. The sixth transistor Tr13-6 of the second logic circuit 13 and the sixth transistor Tr15-6 of the third logic circuit 15 receive the /SEL="0" to be turned OFF. Therefore, in each of the second logic circuit 13 and the third logic circuit 15, a combination of logic inputs, in which all of the first to the third transistors are ON or all of the fourth to the sixth transistors are ON, does not occur.

In the fourth logic circuit 17, the third transistor Tr17-3 receives the clock input CKP="1" to be turned OFF and the fourth transistor Tr17-4 receives the inverted clock input CKN="0" to be turned OFF. Therefore, also in the fourth logic circuit 17, a combination of logic inputs, in which all of the first to the third transistors are ON or all of the fourth to the sixth transistors are ON, does not occur. Therefore, in the first single end operation mode, all of the second logic circuit 13, the third logic circuit 15, and the fourth logic circuit 17 of the latch circuit 1 are in the OFF state.

Figure 5:
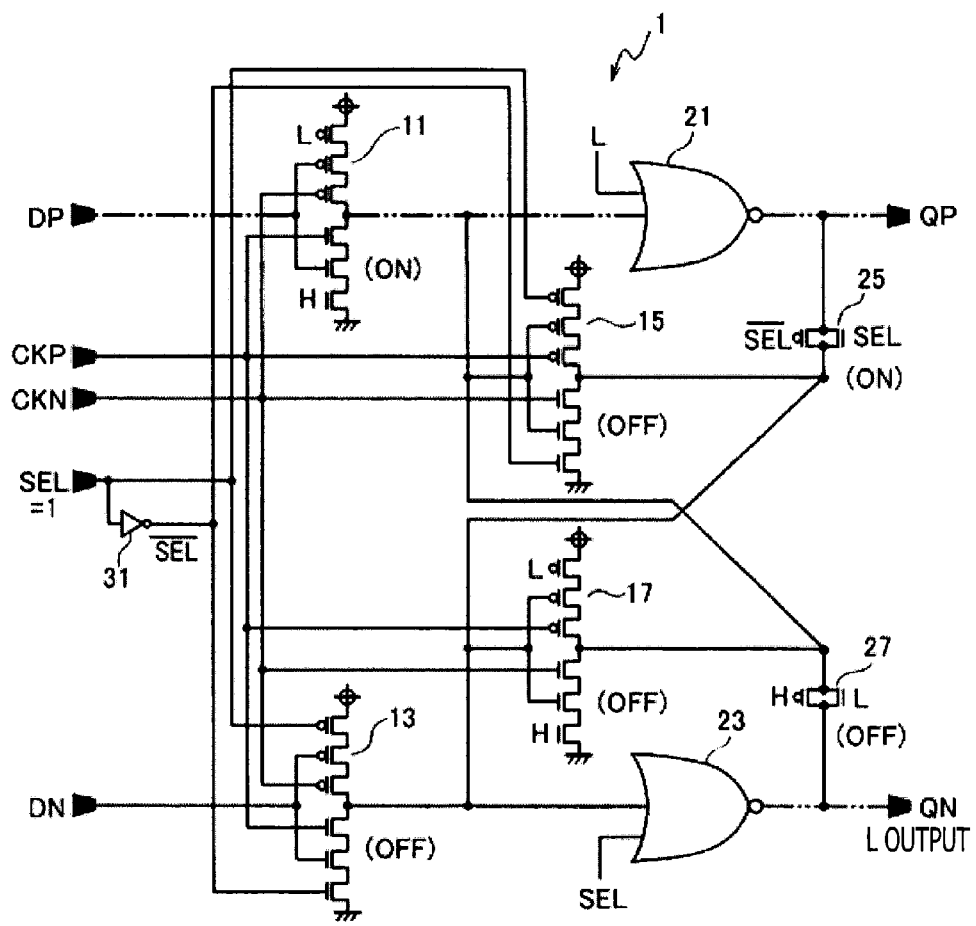
FIG. 5 is a circuit diagram illustrating a flow of signals corresponding to a first single end operation mode of the latch circuit according to the embodiment.

FIG. 5 illustrates the state of the logic circuits and the flow of the signals (two-dot chain lines) in the latch circuit 1 in the first single end operation mode. As illustrated in FIG. 5, during a low speed operation (during the single end operation) in the latch circuit 1, the logic circuits (the second to the fourth logic circuits) that are not related to the single end operation are set to the OFF state and only the minimal logic circuit (the first logic circuit) is set to the ON state. Thereby, it is possible to realize power saving of the latch circuit 1 or power saving in the large scale integrated circuit (LSI) including the latch circuit In the first single end operation mode, as illustrated by (3) and (4) in the truth table in FIG. 7, when the clock input CKP is "1", the inverted clock input CKN is "0", and the logic level of the data input DP is "0", the latch circuit 1 operates as described below. In the latch circuit 1, regardless of (that is, don't care) the value of the data input DN, the NOR gate circuit 21, which receives the output "1" of the first logic circuit 11, outputs "0". This is the same when the logic level of the data input DP is "1", and regardless of (that is, don't care) the value of the input data DN, the NOR gate circuit 21 outputs "1". In short, in the first single end operation, the latch circuit 1 performs an operation (pass-through) in which the value of the data input DP is outputted as the data output QP without change.

Figure 9:
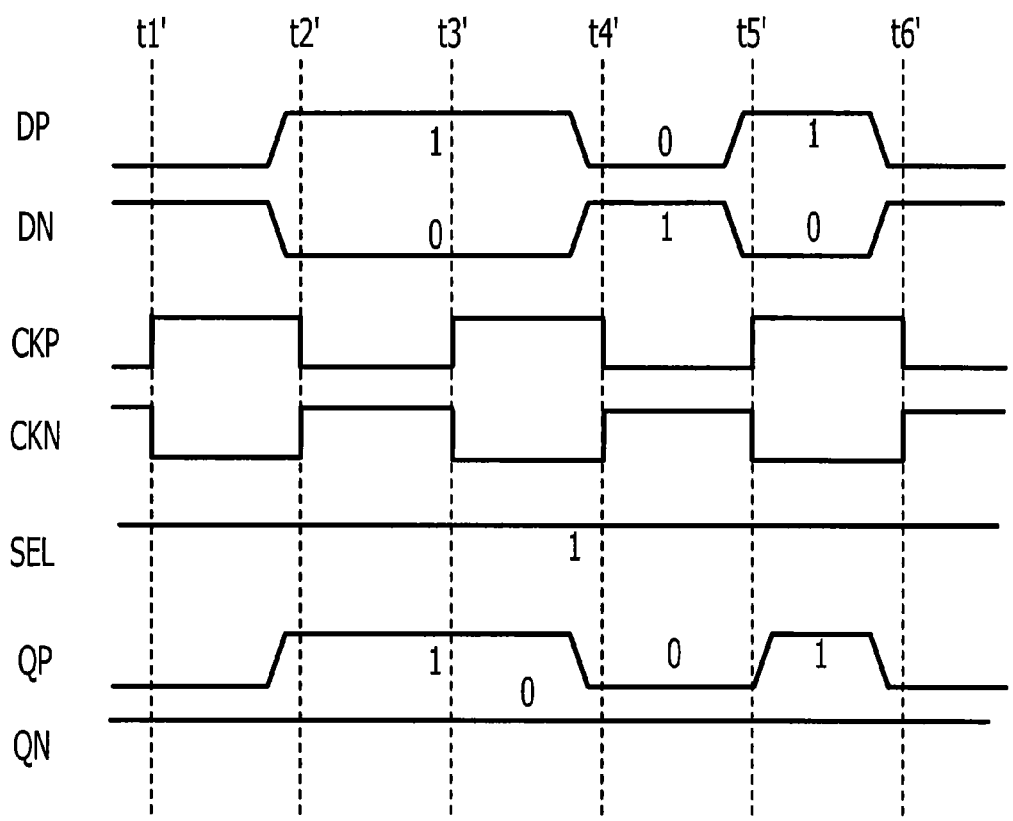
FIG. 9 is a timing chart illustrating operation timing during a single end operation of the latch circuit according to the embodiment.

FIG. 9 is a timing chart illustrating the operation timing of the latch circuit 1 during the single end operation. As illustrated in FIG. 9, when the selection signal SEL is "1", the CKP is "1", and the CKN is "0", that is to say, during the timing t1' to t2', the timing t3' to t4', and the timing t5' to t6', the latch circuit 1 outputs the data input DP as the data output QP without change. This is a pass-through single end operation in the latch circuit 1.

In the latch circuit 1, as illustrated by (3) and (4) in the truth table in FIG. 7, in the first single end operation mode, the data output QN is fixed to logic "0". Thereby, it is possible to reduce a problem that the input terminal of the next stage differential circuit of the latch circuit 1 which operates in the single end operation mode becomes high impedance and LSI or the like malfunctions.

Second Single End Operation Mode

Next, a second single end operation mode, in which input data is latched, of the single end operation of the latch circuit 1 illustrated in FIG. 2 will be described. When causing the latch circuit 1 to perform a latch operation in the single end operation mode, in the same manner as in the first single end operation mode described above, the selection signal SEL is set to "1". At this time, when the clock input CKP is "0" and the inverted clock input CKN is "1", even if the data inputs DP and DN are "0" and "1" respectively or "1" and "0" respectively, the latch circuit 1 operates as described below.

In the first logic circuit 11 of the latch circuit 1 in FIG. 2, the third transistor Tr11-3 receives the CKN="1" to be turned OFF and the fourth transistor Tr11-4 receives the CKP="0" to be turned OFF. The first transistor Tr13-1 of the second logic circuit 13 and the first transistor Tr15-1 of the third logic circuit 15 receive the SEL="1" to be turned OFF. Further, the sixth transistor Tr13-6 of the second logic circuit 13 and the sixth transistor Tr15-6 of the third logic circuit 15 receive the /SEL="0" to be turned OFF. In other words, in the first logic circuit 11, the second logic circuit 13, and the third logic circuit 15, a combination of logic inputs, in which all of the first to the third transistors are ON or all of the fourth to the sixth transistors are ON, does not occur. Therefore, as illustrated in FIG. 6, all of the first logic circuit 11, the second logic circuit 13, and the third logic circuit 15 are in the OFF state.

On the other hand, in the fourth logic circuit 17, as described above, the first transistor Tr17-1 and the sixth transistor Tr17-6 are in the ON state at all times. The third transistor Tr17-3 of the fourth logic circuit 17 receives the CKP="0" to be turned ON and the fourth transistor Tr17-4 receives the CKN="1" to be turned ON. As a result, in the fourth logic circuit 17, all of the first to the third transistors are turned ON or all of the fourth to the sixth transistors are turned ON according to the values of the input data, so that the fourth logic circuit 17 is also set to the ON state.

As described above, the latch circuit 1 in FIG. 2 has a configuration in which the output terminal of the third logic circuit 15 is connected to the input terminals of the fourth logic circuit 17 and the output terminal of the fourth logic circuit 17 is connected to the input terminals of the third logic circuit 15. In the second single end operation mode, the third logic circuit is set to the OFF state and the switch circuit (transfer gate) 25 is set to the ON state by the selection signal SEL="1". A cross-coupled feedback configuration is formed in which the output of the NOR gate circuit 21 is inputted into the fourth logic circuit 17 through the switch circuit 25 and the output of the fourth logic circuit 17 is connected to the input of the NOR gate circuit 21. In other words, there is a feedback signal from the output terminal of the latch circuit 1 to the fourth logic circuit 17. Therefore, when the output (output QP) of the NOR gate circuit 21 immediately before the CKP is turned "0" and the CKN is turned "1" is, for example, "0", the input to the second transistor Tr17-2 and the fifth transistor Tr17-5 of the fourth logic circuit 17 is "0". Therefore, the first to the third transistors of the fourth logic circuit 17 are turned ON and the output of the fourth logic circuit 17 is turned "1".

Figure 6:
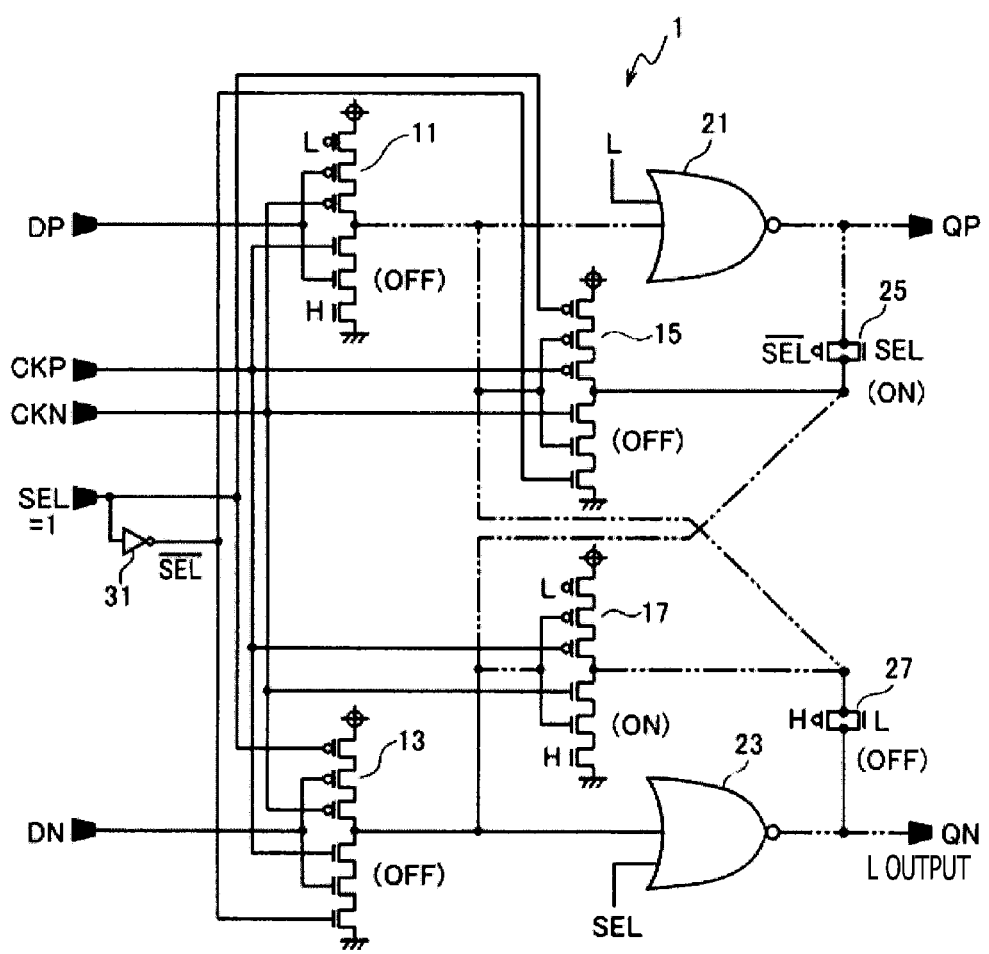
FIG. 6 is a circuit diagram illustrating a flow of signals corresponding to a second single end operation mode of the latch circuit according to the embodiment.

As a result, as illustrated by two-dot chain lines in FIG. 6, a state is maintained in which the input of the NOR gate circuit 21 is "1", the output (output QP) of the NOR gate circuit 21 is "0", the input of the fourth logic circuit 17 is "0", and the output of the fourth logic circuit 17 is "1". In other words, a state is generated in which the value of DP inputted into the latch circuit 1 is held (hold state) and the same value as the inputted DP is outputted as the output QP.

In FIG. 7, (6) of the truth table indicates a case in which the clock input CKP is turned "0" and the inverted clock input CKN is turned "1" during the single end operation of the latch circuit 1 and a data hold operation is performed. In this case, regardless of (that is, don't care) the values of the input data DP and DN, the input data immediately before the above clock state (CKP="0" and CKN="1") is generated is held in the latch circuit 1 and the data output QP corresponding to the input data is maintained without change.

FIG. 9 illustrates an operation timing chart of the latch circuit 1 in the second single end operation mode. As illustrated in FIG. 9, when the CKP is "0" and the CKN is "1", in the timing t2' to t3' and the timing t4' to t5', the latch circuit 1 performs the hold operation to hold the input data without change. In the hold mode, the input data value is held (hold state) by the latch circuit 1 without change until the clock input CKP is turned "1" and the inverted clock input CKN is turned "0" next time.

In the same manner as in the first single end operation mode, also in the second single end operation mode, as illustrated by (6) in the truth table in FIG. 7, the data output QN is fixed to logic "0". Thereby, the input terminal of the next stage differential circuit of the latch circuit which operates in the single end operation mode does not become high impedance.

As illustrated by (7) and (8) in the truth table in FIG. 7, the latch circuit 1 according to the embodiment does not allow a state (a combination of the input values) in which the input data DP and DN are "0" or "1" at the same time. Further, as illustrated by (9) and (10) in the truth table in FIG. 7, the latch circuit 1 does not allow a state (a combination of the clocks) in which the CKP and the CKN are "0" or "1" at the same time.

Figure 10:
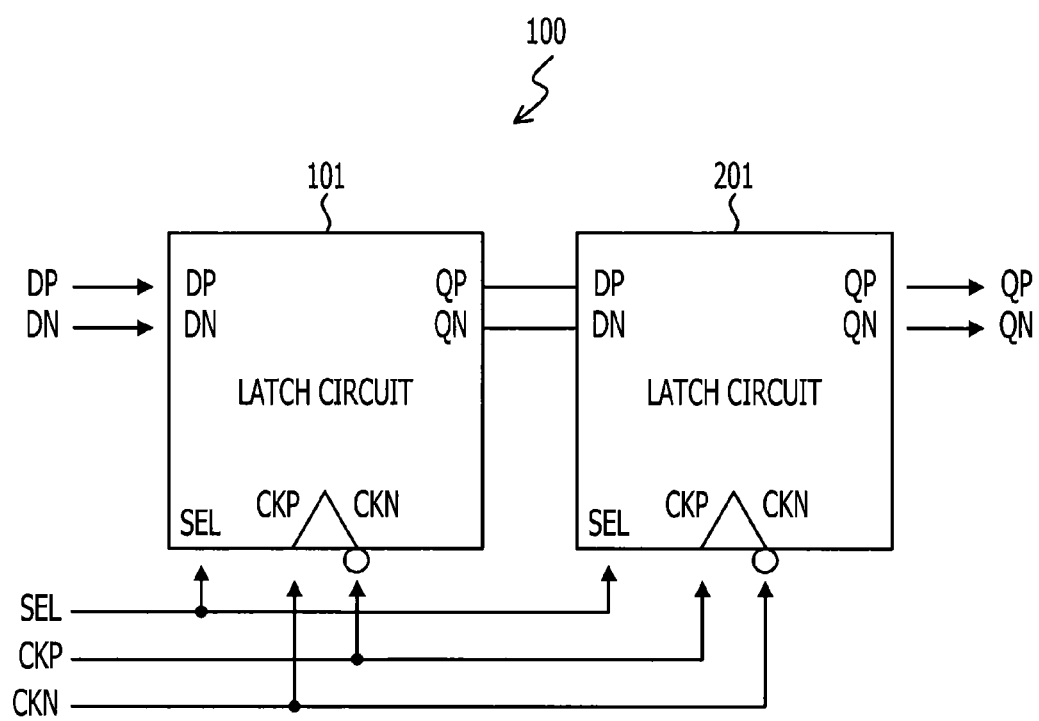
FIG. 10 is a diagram illustrating an example of a flip-flop circuit formed by the latch circuits according to the embodiment.

Next, an application example of the latch circuit 1 according to the embodiment will be described. FIG. 10 illustrates an example of a flip-flop circuit 100 formed by the latch circuits according to the embodiment. In the flip-flop circuit 100 of FIG. 10, the differential data output terminal QP of the latch circuit 101 and the differential data input terminal DP of the latch circuit 201 are connected to each other. In the flip-flop circuit 100, further, the differential data output terminal QN of the latch circuit 101 and the differential data input terminal DN of the latch circuit 201 are connected to each other. The selection signal SEL and the clock inputs CKP and CKN are supplied to both the latch circuits 101 and 201. In this way, the two latch circuit 101 and 201 are connected in tandem and the first stage latch circuit 101 takes(inputs) in and stores the data inputs DP and DN by the change of the logic level of the clock inputs CKP and CKN (edge trigger operation). Similarly, the second stage latch circuit 201 takes (inputs) in and stores the data (QP and QN) outputted from the latch circuit 101 by the change of the logic level of the clock inputs CKP and CKN (edge trigger operation). The input data are held in the flip-flop circuit 100 formed by connecting the latch circuits 101 and 201 in tandem for a certain period of time and thereafter outputted.

Figure 11:
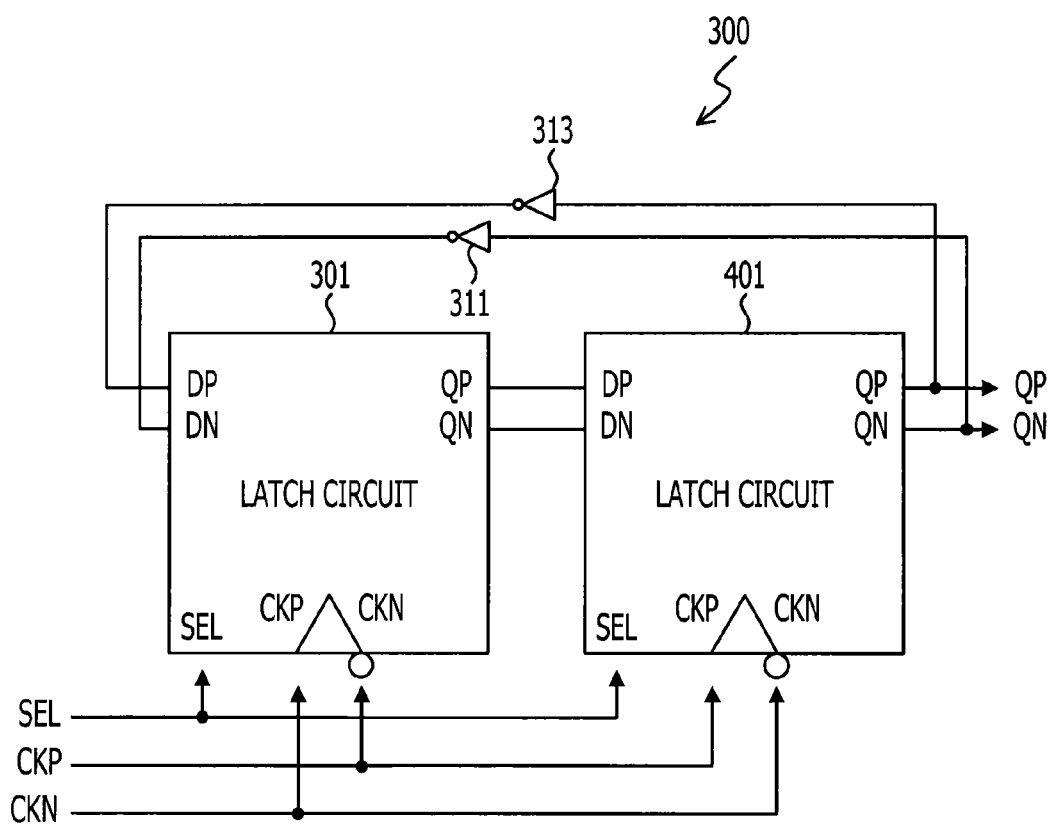
FIG. 11 is a diagram illustrating an example of a divider formed by the latch circuits according to the embodiment.

FIG. 11 illustrates an example of a divider 300 formed by the latch circuits according to the embodiment. Here, two latch circuits 301 and 401 are connected in tandem. In the divider 300 of FIG. 11, the differential data output terminal QP of the latch circuit 301 and the differential data input terminal DP of the latch circuit 401 are connected to each other and the differential data output terminal QN of the latch circuit 301 and the differential data input terminal DN of the latch circuit 401 are connected to each other. The selection signal SEL and the clock inputs CKP and CKN are supplied to both the latch circuits 301 and 401. Further, the output terminal QP of the latch circuit 401 and the input terminal DP of the latch circuit 301 are feedback-connected through an inverter 313. The output terminal QN of the latch circuit 401 and the input terminal DN of the latch circuit 301 are feedback-connected through an inverter 311. In the divider 300 illustrated in FIG. 11, the outputs QP and QN of the second stage latch circuit 401 are logically inverted and inputted into the first stage latch circuit 301, so that a signal of frequency f inputted into the clock input terminals CKP and CKN is converted (divided) into a signal of frequency f/2.

In both of the flip-flop circuit 100 illustrated in FIG. 10 and the divider 300 illustrated in FIG. 11, the latch circuits are operated as differential circuits when a high speed operation is performed and the latch circuits are operated as single end circuits when a low speed operation is performed, so that power saving can be achieved.

As described above, in the embodiment, the latch circuit is switched to operate as a differential circuit or a single end circuit according to the logic level of the selection signal. In addition, each logic circuit is set to the ON state or the OFF state according to logic inputs to a plurality of logic circuits included in the latch circuit. Thereby, it is unnecessary to provide an individual operation circuit for the differential operation and an individual operation circuit for the single end operation in one latch circuit. Further, additional circuits such as a clock distribution circuit and an output selector as illustrated in FIG. 13 are unnecessary. As a result, it is possible to greatly reduce the increase of the circuit size of the latch circuit, so that, when the latch circuit is built in a large scale integrated circuit, the degree of integration of the large scale integrated circuit can be increased.

During a low speed operation (single end operation), logic circuits not related to the single end operation are set to the OFF state and only a minimal logic circuit is set to the ON state. Thereby, it is possible to realize power saving in the latch circuit and a large scale integrated circuit (LSI) including the latch circuit. Specifically, it is possible to reduce useless power consumption caused by switching a high speed operation circuit and a low speed operation circuit which are separately provided as illustrated in FIG. 13 and supplying signals and the like to the high speed operation circuit even when the circuit is operated at a low speed.

Further, one input terminal DP of the differential data inputs is connected to a predetermined number of transistor gate electrodes of the first logic circuit and the other input terminal DN of the differential data inputs is connected to the same number of transistor gate electrodes of the second logic circuit. By such a configuration, the number of fan-outs of the input terminal DP and the number of fan-outs of the input terminal DN are the same. Therefore, the problem that the input loads are not balanced does not occur. The input loads are balanced, so that a load adjustment unit to keep balance of the input terminals is unnecessary.

Figure 12A:
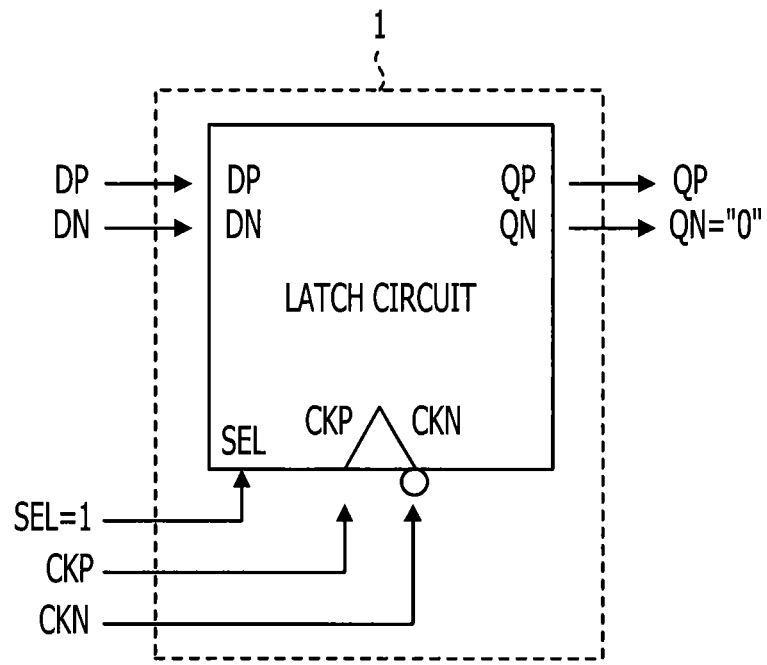
FIGS. 12A and 12B are diagrams illustrating a configuration example in which a data input terminal DN (N side) is used during a single end operation of the latch circuit according to the embodiment.
Figure 12B:
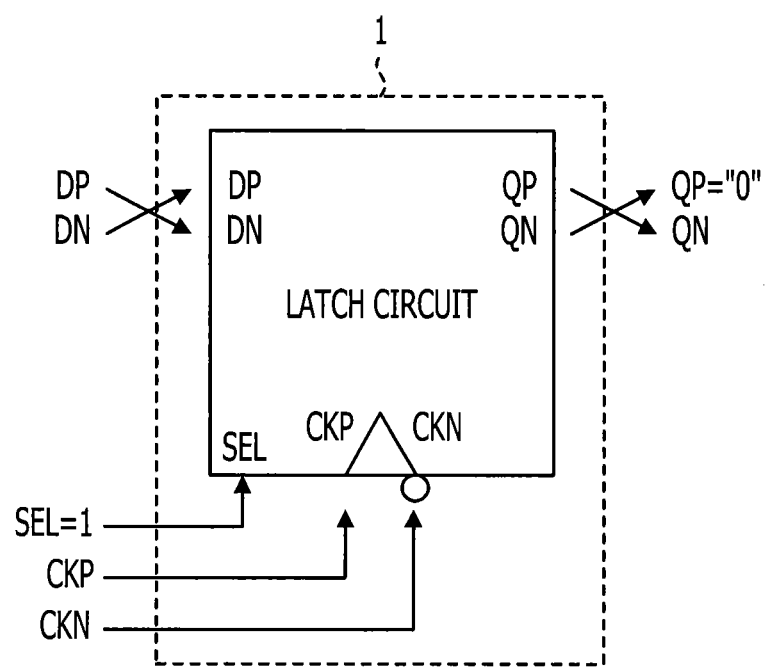

In the latch circuit according to the above embodiment, a case in which the data input terminal DP (P side) is used during the single end operation as illustrated in FIG. 12A is described as an example. However, the terminal used for the single end operation is not restricted to this. For example, a configuration may be employed in which the single end operation is performed by using the data input terminal DN (N side). In this case, as illustrated in FIG. 12B, the P side signal and the N side signal are switched to each other at the input/output terminals. Specifically, at the input/output terminals of the latch circuit 1, the P side signal of the outside of the latch circuit 1 (the outside of the dotted line in FIG. 12B) is connected to the N side signal of the latch circuit 1 and the N side signal of the outside of the latch circuit 1 is connected to the P side signal of the latch circuit 1.

Also in the configuration illustrated in FIG. 12B, in the same manner as in the single end operation in the above embodiment, the data output QP is fixed to logic "0" so that the input terminal of the second stage differential circuit does not become high impedance.

In the above embodiment, the latch circuit is switched so that the latch circuit is caused to perform the differential operation during a high speed operation and perform the single end operation during a low speed operation. However, it is not restricted to this. For example, when the operation speed of the latch circuit is fixed, the latch circuit may be switched so that the latch circuit operates in the single end operation mode when the power consumption is desired to be reduced and the latch circuit operates in the differential operation mode when the power consumption is not desired to be reduced.

In the first logic circuit 11 and the fourth logic circuit 17 of the latch circuit according to the above embodiment, the transistors whose gate electrode is fixed to a predetermined logic level may be omitted. Specifically, a configuration may be employed in which the first transistors Tr11-1 and Tr17-1 whose gate electrode is fixed to logic "L" and the sixth transistors Tr11-6 and Tr17-6 whose gate electrode is fixed to logic "H" are omitted. By doing so, waste power consumption caused by these transistors, which are in the ON state at all times, can be reduced. The size of the latch circuit can be reduced by the size of the omitted transistors. However, when the transistors are omitted, the balance of the loads of the differential input signals may be lost. Therefore the latch circuit is designed so that the performance in a high speed operation is not affected.

All documents, patent applications, and technical standards described in the present specification are incorporated herein by reference to the same extent as if each document, patent application, and technical standard were specifically and individually indicated to be incorporated herein by reference.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A latch circuit comprising:
   a first logic circuit configured to receive an input signal from a first input terminal and output a first output signal;
   a second logic circuit configured to receive an inverted input signal, which is obtained by logically inverting the input signal, from a second input terminal and output a second output signal;
   a third logic circuit configured to input in the first output signal and a fourth output signal and output a third output signal; and
   a fourth logic circuit configured to input in the second output signal and the third output signal and output the fourth output signal,
   wherein the latch circuit switches a differential operation performed by a differential operation circuit including the first logic circuit, the second logic circuit, the third logic circuit, and the fourth logic circuit and a single end operation performed by a single end operation circuit according to a logic level of an inputted selection signal, and
   according to logic levels of an inputted clock signal and an inverted clock signal which is obtained by logically inverting the clock signal, the latch circuit performs an operation to output the input signal and the inverted input signal without change from a first output terminal and a second output terminal of the latch circuit, respectively, and an operation to set the input signal and the inverted input signal in a hold state in the differential operation and performs an operation to output the input signal from the first output terminal without change and an operation to set the input signal in a hold state in the single end operation.

2. The latch circuit according to claim 1, wherein
   the selection signal is set to a first logic level, and
   when the clock signal is a second logic level and the inverted clock signal is the first logic level, the first logic circuit and the second logic circuit are in an operational state and the third logic circuit and the fourth logic circuit are in a non-operational state to form the differential operation circuit, and logic values of the input signal and the inverted input signal are outputted from the first output terminal and the second output terminal respectively without change.

3. The latch circuit according to claim 1, wherein
   the selection signal is set to a first logic level, and
   when the clock signal is the first logic level and the inverted clock signal is a second logic level, the first logic circuit and the second logic circuit are in a non-operational state and the third logic circuit and the fourth logic circuit are in an operational state to form the differential operation circuit, and logic values of the input signal and the inverted input signal immediately before the clock signal becomes the first logic level and the inverted clock signal becomes the second logic level are held.

4. The latch circuit according to claim 1, wherein
   the selection signal is set to a second logic level, and
   when the clock signal is the second logic level and the inverted clock signal is a first logic level, the first logic circuit is in an operational state and the second logic circuit, the third logic circuit, and the fourth logic circuit are in a non-operational state to form the single end operation circuit, and a logic value of the input signal is outputted from the first output terminal without change.

5. The latch circuit according to claim 4, wherein
   in the single end operation, an output of the second output terminal is fixed to the first logic level.

6. The latch circuit according to claim 1, wherein
   the selection signal is set to a second logic level, and
   when the clock signal is a first logic level and the inverted clock signal is the second logic level, the first logic circuit, the second logic circuit, and the third logic circuit are in a non-operational state and the fourth logic circuit is in an operational state to form the single end operation circuit, and a logic value of the input signal immediately before the clock signal becomes the first logic level and the inverted clock signal becomes the second logic level is held.

7. The latch circuit according to claim 1, wherein
   each of the first logic circuit, the second logic circuit, the third logic circuit, and the fourth logic circuit includes
   a first transistor of P-type MOS,
   a second transistor of P-type MOS connected to the first transistor in series,
   a third transistor of P-type MOS connected to the second transistor in series,
   a fourth transistor of N-type MOS connected to the third transistor in series,
   a fifth transistor of N-type MOS connected to the fourth transistor in series, and
   a sixth transistor of N-type MOS connected to the fifth transistor in series.

8. The latch circuit according to claim 7, wherein
   a signal of a first logic level is inputted into the first transistor of the first logic circuit,
   the input signal is inputted into the second transistor and the fifth transistor of the first logic circuit,
   the inverted clock signal is inputted into the third transistor of the first logic circuit,
   the clock signal is inputted into the fourth transistor of the first logic circuit and a signal of a second logic level is inputted into the sixth transistor of the first logic circuit,
   the selection signal is inputted into the first transistor of the second logic circuit,
   the inverted input signal is inputted into the second transistor and the fifth transistor of the second logic circuit,
   the inverted clock signal is inputted into the third transistor of the second logic circuit, the clock signal is inputted into the fourth transistor of the second logic circuit, the inverted selection signal is inputted into the sixth transistor of the second logic circuit, the selection signal is inputted into the first transistor of the third logic circuit, the first output signal and the fourth output signal are inputted into the second transistor and the fifth transistor of the third logic circuit, the clock signal is inputted into the third transistor of the third logic circuit, the inverted clock signal is inputted into the fourth transistor of the third logic circuit, the inverted selection signal is inputted into the sixth transistor of the third logic circuit, a signal of the first logic level is inputted into the first transistor of the fourth logic circuit, the second output signal and the third output signal are inputted into the second transistor and the fifth transistor of the fourth logic circuit, the clock signal is inputted into the third transistor of the fourth logic circuit, the inverted clock signal is inputted into the fourth transistor of the fourth logic circuit, and a signal of the second logic level is inputted into the sixth transistor of the fourth logic circuit.

9. A flip-flop circuit comprising:

a first latch circuit; and a second latch circuit connected in tandem with the first latch circuit, wherein each of the first latch circuit and the second latch circuit includes a first logic circuit configured to receive an input signal from a first input terminal and output a first output signal, a second logic circuit configured to receive an inverted input signal, which is obtained by logically inverting the input signal, from a second input terminal and output a second output signal, a third logic circuit configured to input in the first output signal and a fourth output signal and output a third output signal, and a fourth logic circuit configured to input in the second output signal and the third output signal and output the fourth output signal, each of the first latch circuit and the second latch circuit switches a differential operation performed by a differential operation circuit including the first logic circuit, the second logic circuit, the third logic circuit, and the fourth logic circuit and a single end operation performed by a single end operation circuit according to a logic level of an inputted selection signal, and according to logic levels of an inputted clock signal and an inverted clock signal which is obtained by logically inverting the clock signal, the latch circuit performs an operation to output the input signal and the inverted input signal without change from a first output terminal and a second output terminal of the latch circuit, respectively, and an operation to set the input signal and the inverted input signal in a hold state in the differential operation and performs an operation to output the input signal from the first output terminal without change and an operation to set the input signal in a hold state in the single end operation.

10. A divider comprising:

a first latch circuit configured to include an input terminal;

a second latch circuit which includes an output terminal and which is connected in tandem with the first latch circuit; and an inverter configured to connect between the input terminal and the output terminal, wherein each of the first latch circuit and the second latch circuit includes a first logic circuit configured to receive an input signal from a first input terminal and output a first output signal, a second logic circuit configured to receive an inverted input signal, which is obtained by logically inverting the input signal, from a second input terminal and output a second output signal, a third logic circuit configured to input in the first output signal and a fourth output signal and output a third output signal, and a fourth logic circuit configured to input in the second output signal and the third output signal and output the fourth output signal, each of the first latch circuit and the second latch circuit switches a differential operation performed by a differential operation circuit including the first logic circuit, the second logic circuit, the third logic circuit, and the fourth logic circuit and a single end operation performed by a single end operation circuit according to a logic level of an inputted selection signal, and according to logic levels of an inputted clock signal and an inverted clock signal which is obtained by logically inverting the clock signal, the latch circuit performs an operation to output the input signal and the inverted input signal without change from a first output terminal and a second output terminal of the latch circuit, respectively, and an operation to set the input signal and the inverted input signal in a hold state in the differential operation and performs an operation to output the input signal from the first output terminal without change and an operation to set the input signal in a hold state in the single end operation.

* * * * *